United States Patent
Yamashita et al.

(10) Patent No.: US 11,208,584 B2
(45) Date of Patent: Dec. 28, 2021

(54) HEAT REGENERATING MATERIAL, REGENERATOR, REFRIGERATOR, SUPERCONDUCTING MAGNET, NUCLEAR MAGNETIC RESONANCE IMAGING APPARATUS, NUCLEAR MAGNETIC RESONANCE APPARATUS, CRYOPUMP, AND MAGNETIC FIELD APPLICATION TYPE SINGLE CRYSTAL PULLING APPARATUS

(71) Applicant: Kabushiki Kaisha Toshiba, Minato-ku (JP)

(72) Inventors: Tomohiro Yamashita, Yokohama (JP); Takahiro Kawamoto, Kawasaki (JP); Tomoko Eguchi, Yokohama (JP); Masaya Hagiwara, Yokohama (JP); Akiko Saito, Kawasaki (JP); Takashi Kuboki, Ota (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 36 days.

(21) Appl. No.: 16/292,373

(22) Filed: Mar. 5, 2019

(65) Prior Publication Data
US 2020/0087558 A1    Mar. 19, 2020

(30) Foreign Application Priority Data
Sep. 18, 2018   (JP) .............................. JP2018-174316

(51) Int. Cl.
*C09K 5/14* (2006.01)
*C08K 3/22* (2006.01)
(Continued)

(52) U.S. Cl.
CPC .................. *C09K 5/14* (2013.01); *C08K 3/22* (2013.01); *G01R 33/3804* (2013.01); *H01F 6/04* (2013.01);
(Continued)

(58) Field of Classification Search
CPC ..... C09K 5/00; C09K 5/14; F25B 9/00; F25B 1/00; F25B 2309/003; F25D 17/02; F25D 31/00
(Continued)

(56) References Cited

U.S. PATENT DOCUMENTS 4,866,943 A * 9/1989 Purcell .................... F02G 1/057
                                                      62/6
4,985,072 A    1/1991 Sahashi et al.
(Continued)

FOREIGN PATENT DOCUMENTS

JP    62-77438        4/1967
JP    2000-199650     7/2000
(Continued)

*Primary Examiner* — Jane L Stanley
(74) *Attorney, Agent, or Firm* — Oblon, McClelland, Maier & Neustadt, L.L.P.

(57) ABSTRACT

A heat regenerating material particle according to an embodiment includes a plurality of heat regenerating substance particles having a maximum volume specific heat value of 0.3 J/cm$^3$·K or more at a temperature of 20 K or lower, and a binder bonding the heat regenerating substance particles, the binder containing water insoluble resin. The heat regenerating material particle has a particle diameter of 500 μm or less.

7 Claims, 12 Drawing Sheets

(51) Int. Cl.
  *G01R 33/38* (2006.01)
  *H01F 6/04* (2006.01)
  *F25B 9/14* (2006.01)
(52) U.S. Cl.
  CPC ............... *C08K 2003/2248* (2013.01); *C08K 2003/2286* (2013.01); *F25B 9/14* (2013.01); *F25B 2309/003* (2013.01)
(58) Field of Classification Search
  USPC .......................................................... 252/75
  See application file for complete search history.

(56) References Cited

U.S. PATENT DOCUMENTS

| | | | | |
|---|---|---|---|---|
| 6,197,127 | B1* | 3/2001 | Okamura | F25B 9/14 148/301 |
| 6,363,727 | B1 | 4/2002 | Hashimoto et al. | |
| 2002/0026799 | A1* | 3/2002 | Okamura | C09K 5/14 62/6 |
| 2005/0070658 | A1* | 3/2005 | Ghosh | F25D 21/08 524/495 |
| 2006/0155043 | A1* | 7/2006 | Johnson | C08K 3/04 524/495 |
| 2011/0141698 | A1* | 6/2011 | Chiou | H01L 23/3737 361/708 |
| 2015/0135732 | A1* | 5/2015 | Pourrahimi | F25D 17/02 62/51.1 |
| 2017/0122625 | A1 | 5/2017 | Endo et al. | |
| 2018/0051916 | A1 | 2/2018 | Eguchi et al. | |

FOREIGN PATENT DOCUMENTS

| | | |
|---|---|---|
| JP | 2017-58079 | 3/2017 |
| JP | 2018-28045 | 2/2018 |
| JP | 2019-19038 | 2/2019 |

* cited by examiner

HEAT REGENERATING MATERIAL, REGENERATOR, REFRIGERATOR, SUPERCONDUCTING MAGNET, NUCLEAR MAGNETIC RESONANCE IMAGING APPARATUS, NUCLEAR MAGNETIC RESONANCE APPARATUS, CRYOPUMP, AND MAGNETIC FIELD APPLICATION TYPE SINGLE CRYSTAL PULLING APPARATUS

CROSS-REFERENCE TO RELATED APPLICATION

This application is based upon and claims the benefit of priority from Japanese Patent Application No. 2018-174316, filed on Sep. 18, 2018, the entire contents of which are incorporated herein by reference.

FIELD

Embodiments described herein relate generally to heat regenerating material particle, regenerator, refrigerator, superconducting magnet, nuclear magnetic resonance imaging apparatus, nuclear magnetic resonance apparatus, cryopump, and magnetic field application type single crystal pulling apparatus.

BACKGROUND

For a cryogenic refrigerator used for cooling a superconducting device or the like, heat regenerating material particles having a high volume specific heat value in a low temperature range are used. Here, specific heat per unit volume is defined as volume specific heat. Examples of the heat regenerating material particles include a metal such as lead (Pb) or bismuth (Bi), a rare earth compound such as $HoCu_2$ or $Er_3Ni$, and an oxide such as $Ag_2O$, $Cu_2O$, or $Gd_2O_2S$.

For example, in a case of manufacturing oxide heat regenerating material particles, multistage processes such as granulation of a powder raw material, sintering at high temperature, and spheroidizing by polishing are required. Therefore, a manufacturing process is complicated and manufacturing cost is high.

DETAILED DESCRIPTION

A heat regenerating material particle according to an embodiment includes a plurality of heat regenerating substance particles having a maximum volume specific heat value of 0.3 $J/cm^3·K$ or more at a temperature of 20 K or lower, and a binder bonding the heat regenerating substance particles, the binder containing water insoluble resin. The heat regenerating material particle has a particle diameter of 500 μm or less.

Hereinafter, embodiments of the present disclosure will be described with reference to the drawings. Incidentally, in the following description, the same sign will be given to the same or a similar member or the like, and description of a member or the like described once will be omitted appropriately.

Here, a cryogenic temperature means, for example, a temperature range in which a superconducting phenomenon can be usefully utilized industrially. For example, the cryogenic temperature is in a temperature range of 20 K or lower.

First Embodiment

A heat regenerating material particle according to a first embodiment includes a plurality of heat regenerating substance particles having a maximum volume specific heat value of 0.3 $J/cm^{-3}·K$ or more at a temperature of 20 K or lower, and a binder bonding the heat regenerating substance particles, the binder containing water insoluble resin. The heat regenerating material particle has a particle diameter of 500 μm or less.

Figure 1:
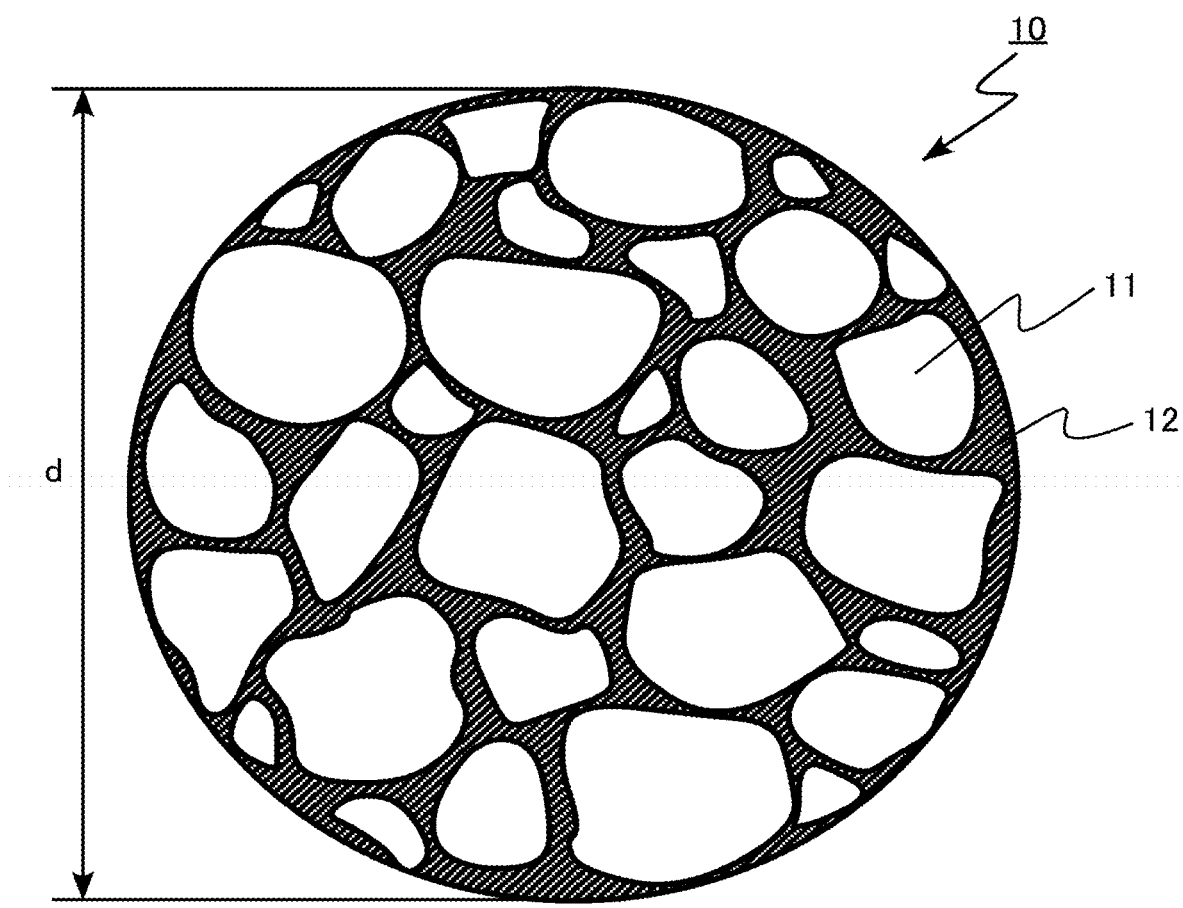
FIG. 1 is a schematic cross-sectional view of a heat regenerating material particle according to a first embodiment.

FIG. 1 is a schematic cross-sectional view of the heat regenerating material particle according to the first embodiment. A heat regenerating material particle 10 according to the first embodiment is used, for example, for a refrigerator achieving a cryogenic temperature of 5 K or lower.

The shape of the heat regenerating material particle 10 is, for example, a spherical shape, a bale shape, a spheroid shape, or an irregular shape, and is not particularly limited. FIG. 1 illustrates a case where the heat regenerating material particle 10 has a spherical shape.

The heat regenerating material particle 10 has a particle diameter (d in FIG. 1) of 500 μm or less. The particle diameter d of the heat regenerating material particle 10 is, for example, 100 μm or more and 500 μm or less. The particle diameter d is more preferably 150 μm or more and 300 μm or less. The particle diameter d is still more preferably 180 μm or more and 250 μm or less.

The particle diameter d of the heat regenerating material particle 10 is a circle equivalent diameter. The circle equivalent diameter is the diameter of a perfect circle corresponding to the area of a figure observed in an image such as an optical microscope image or a scanning electron microscope image (SEM image). The particle diameter d of the heat regenerating material particle 10 can be determined by image analysis of an optical microscope image or an SEM image, for example.

The heat regenerating material particle 10 includes a plurality of heat regenerating substance particles 11 and a binder 12. The heat regenerating substance particles 11 and the binder 12 have different compositions from each other, and therefore can be distinguished from each other, for example, with a scanning electron microscope-backscattered electron composition image (SEM-BSE COMP image) or by scanning electron microscope-energy dispersive X-ray spectroscopy (SEM-EDX).

The heat regenerating substance particles 11 have a maximum volume specific heat value of 0.3 J/cm$^3$·K or more at a temperature of 20 K or lower. The number of the heat regenerating substance particles 11 in the heat regenerating material particle 10 is, for example, 10 or more and 10,000 or less.

The shape of each of the heat regenerating substance particles 11 is, for example, a spherical shape, a bale shape, a spheroid shape, or an irregular shape, and is not particularly limited. FIG. 1 illustrates a case where each of the heat regenerating substance particles 11 has an irregular shape.

The particle diameter of each of the heat regenerating substance particles 11 is, for example, 0.01 μm or more and 10 μm or less. The median particle diameter of each of the heat regenerating substance particles 11 is, for example, 0.01 μm or more and 50 μm or less.

Figure 2:
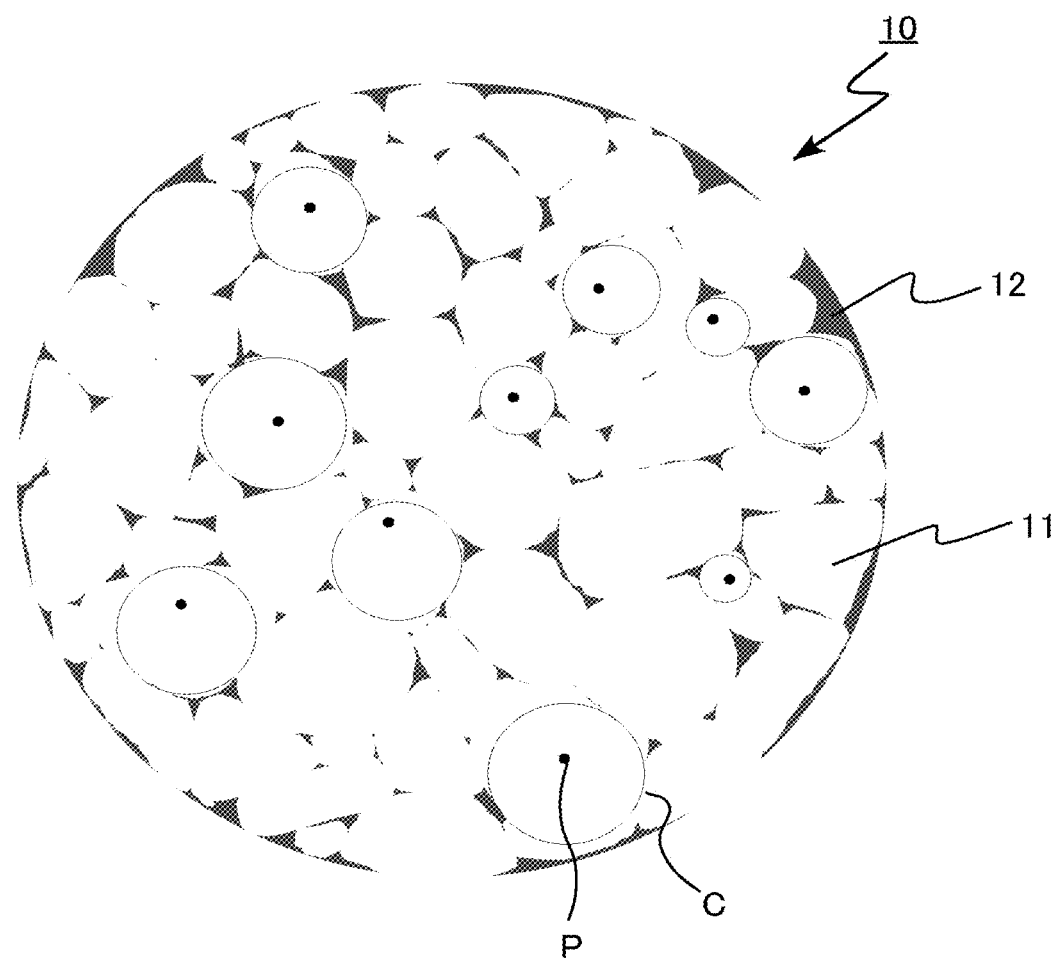
FIG. 2 is an explanatory diagram of a method for measuring the particle diameter of a heat regenerating substance particle according to the first embodiment.

FIG. 2 is an explanatory diagram of a method for measuring the particle diameter of each of the heat regenerating substance particles 11 according to the first embodiment. FIG. 2 particularly illustrates a case where there is a portion where the adjacent heat regenerating substance particles 11 are in direct contact with each other without the binder 12 between the particles.

The median particle diameter of the heat regenerating substance particles 11 is determined, for example, by selecting any 10 points of the heat regenerating substance particles 11 in the heat regenerating material particle 10 in an observation image and determining a median value of the diameters of maximum circles (C in FIG. 2) including these points (P in FIG. 2) but not including the binder 12. In case the selected points of the heat regenerating substance particles 11 is an even number, the median value may be an arithmetic mean of two values of the diameters of maximum circles closest to center of a distribution of the diameters of maximum circles. For example, by image analysis of an SEM image, it is possible to determine the particle diameters and a median value of the particle diameters of the heat regenerating substance particles 11.

Incidentally, even when a grain boundary of the adjacent heat regenerating substance particles 11 is not necessarily clear, the particle diameter of each of the heat regenerating substance particles 11 can be determined as illustrated in FIG. 2, for example, in accordance with the above definition.

The heat regenerating substance particles 11 contain, for example, an oxide as a main component. The oxide contained in the heat regenerating substance particles 11 contains, for example, at least one of silver (Ag) and copper (Cu). Examples of the oxide contained in the heat regenerating substance particles 11 include $Ag_2O$ and $Cu_2O$. $Ag_2O$ and $Cu_2O$ are nonmagnetic materials.

The oxide contained in the heat regenerating substance particles 11 contains, for example, gadolinium (Gd) and sulfur (S). Examples of the oxide contained in the heat regenerating substance particles 11 include $Gd_2O_2S$. $Gd_2O_2S$ is a magnetic material.

The heat regenerating substance particles 11 contain, for example, a rare earth compound as a main component. Examples of the rare earth compound contained in the heat regenerating substance particles 11 include $HoCu_2$ and $Er_3Ni$. $HoCu_2$ and $Er_3Ni$ are magnetic materials.

Composition analysis of the heat regenerating substance particles 11 can be performed by energy dispersive X-ray spectroscopy, for example.

The binder 12 contains a water insoluble resin as a main component. The binder 12 is a resin binder. The binder 12 bonds the heat regenerating substance particles 11 to each other.

Examples of the water insoluble resin contained in the binder 12 include a polyvinyl butyral resin (PVB), a polyamide resin, and an epoxy resin. The polyvinyl butyral resin (PVB) is preferable because of having high temperature cycle resistance. The epoxy resin is preferable because of having high mechanical strength.

The heat regenerating substance particles 11 contained in the heat regenerating material particle 10 have an occupancy ratio of 60% by volume or more and 95% by volume or less, for example. The binder 12 contained in the heat regenerating material particle 10 has an occupancy ratio of 5% by volume or more and 40% by volume or less, for example.

The heat regenerating material particle 10 has a porosity of less than 20% by volume, for example. The porosity of the heat regenerating material particle 10 is the occupancy ratio of voids present in the heat regenerating material particle 10.

The occupancy ratio of the heat regenerating substance particles 11 contained in the heat regenerating material particle 10, the occupancy ratio of the binder 12 contained in the heat regenerating material particle 10, and the porosity of the heat regenerating material particle 10 are represented, for example, by the area ratios occupied by the heat regenerating substance particles 11, the binder 12, and voids observed in an optical microscope image or an SEM image, respectively. The occupancy ratio of the heat regenerating substance particles 11 contained in the heat regenerating material particle 10, the occupancy ratio of the binder 12 contained in the heat regenerating material particle 10, and the porosity of the heat regenerating material particle 10 can be determined, for example, by image analysis of an optical microscope image or an SEM image.

Next, a first example of a method for manufacturing the heat regenerating material particle 10 according to the first embodiment will be described. Hereinafter, a case where the heat regenerating substance particles 11 are formed of $Ag_2O$ and the binder 12 is formed of a polyvinyl butyral resin (PVB) will be exemplified.

FIGS. 3A, 3B, 3C, and 3D are explanatory diagrams of the first example of the method for manufacturing the heat regenerating material particle according to the first embodiment. FIGS. 4A and 4B are top views of a punching sheet used in the first example of the method for manufacturing the heat regenerating material particle according to the first embodiment.

First, $Ag_2O$ powder is synthesized in a wet manner.

Next, a polyvinyl butyral resin and an organic solvent are each weighed and mixed to dissolve the polyvinyl butyral resin in the organic solvent.

Hereinafter, this solution is referred to as a binder solution.

The amount of the polyvinyl butyral resin in the binder solution is, for example, 5% by weight. Examples of the organic solvent include acetone and ethanol.

Next, $Ag_2O$ powder and the binder solution are each weighed and mixed to prepare a slurry 28. Next, the slurry 28 is mixed while the solvent in the slurry 28 is volatilized. As the solvent in the slurry 28 is volatilized, the viscosity of the slurry 28 increases.

Figure 3A:
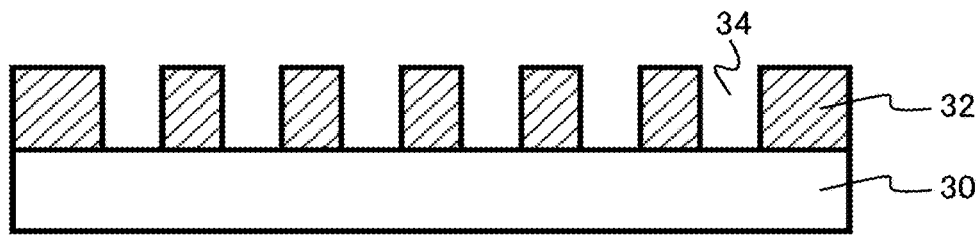
FIGS. 3A, 3B, 3C, and 3D are explanatory diagrams of a first example of a method for manufacturing the material particles according to the first embodiment.
Figure 3B:
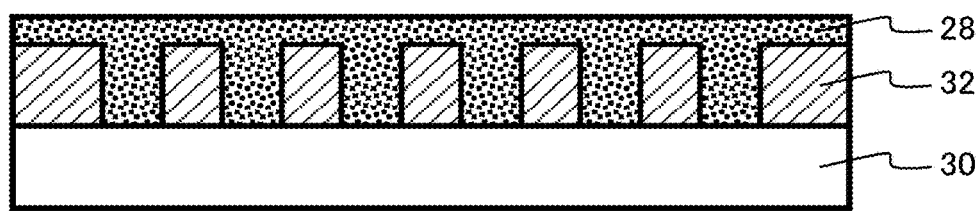
Figure 4A:
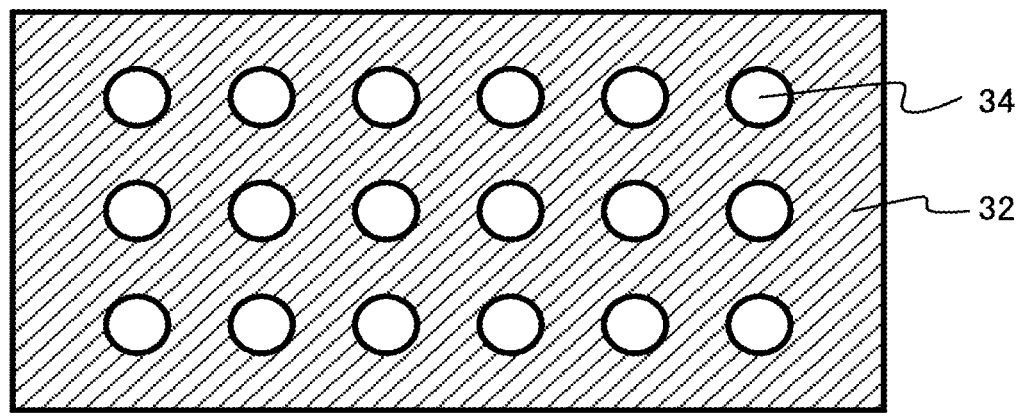
FIGS. 4A and 4B are top views of a punching sheet used in the first example of the method for manufacturing the heat regenerating material particles according to the first embodiment.
Figure 4B:
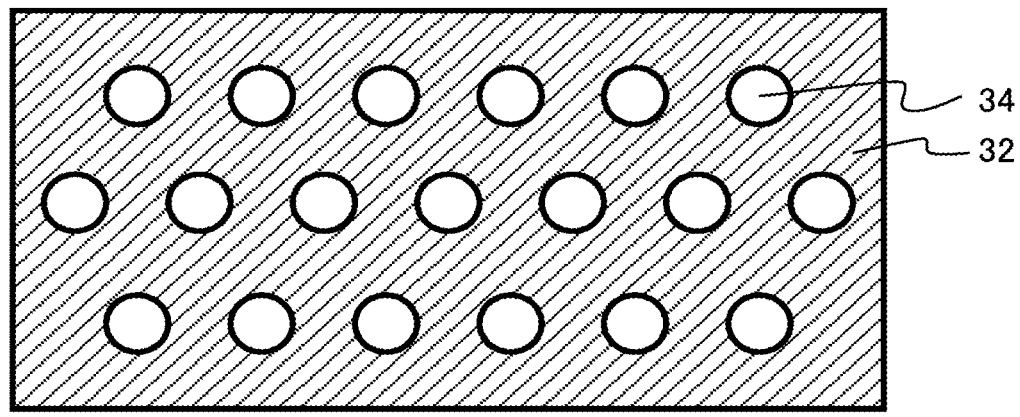

Next, a punching sheet 32 is disposed on a pedestal 30 (FIG. 3A). Next, in a stage when the viscosity of the slurry 28 increases and the slurry 28 becomes clay-like, the slurry 28 is embedded in the punching sheet 32 (FIG. 3B).

As illustrated in FIGS. 4A and 4B, for example, the punching sheet 32 is a flat plate in which a large number of holes 34 each having a predetermined size are provided. The punching sheet 32 preferably has high resistance to a solvent and preferably easily removes particles formed by solidification of the slurry 28.

Figure 3C:
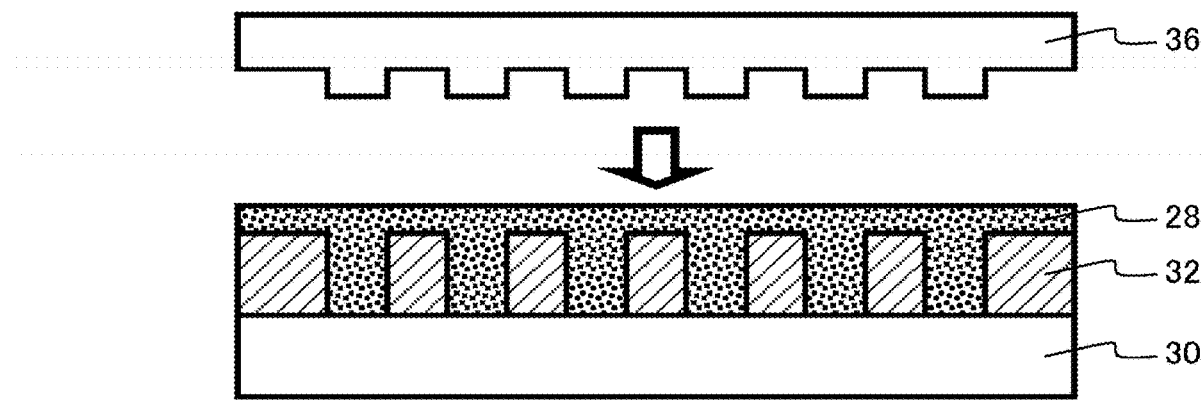
Figure 3D:
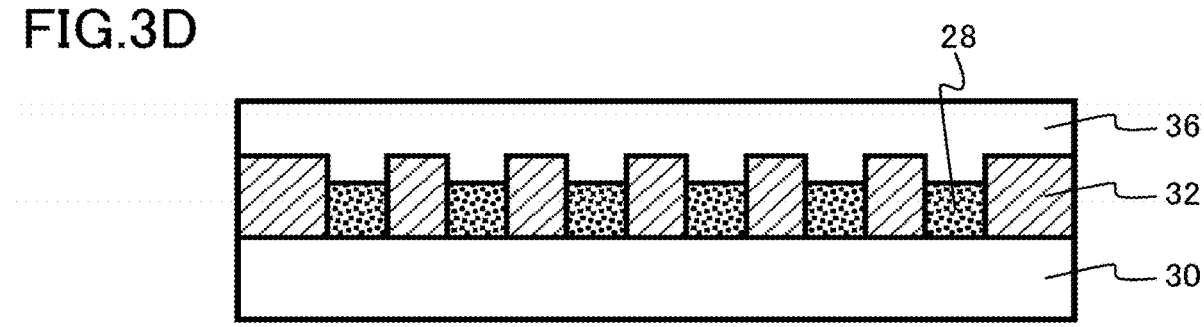

Next, the slurry 28 embedded in the punching sheet 32 is pressurized using a die 36 (FIGS. 3C and 3D). Pressurizing the slurry 28 increases the density of the particles formed by solidification of the slurry 28.

For example, the slurry 28 embedded in the punching sheet 32 may be pushed and pressurized with a rod-shaped member instead of the die 36. For example, the slurry 28 may be pressurized together with the punching sheet 32.

Next, the particles formed by solidification of the slurry 28 are removed from the punching sheet 32. For example, the particles are pushed and removed with a rod-shaped member.

Next, the removed particles are polished by barrel polishing or the like to round corners for spheroidizing and reduction in diameter. The heat regenerating material particle 10 having a desired shape and particle diameter is manufactured by polishing.

Figure 5A:
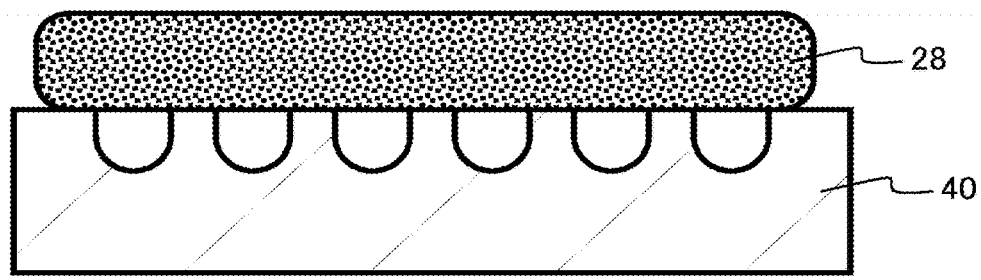
FIGS. 5A, 5B, and 5C are explanatory diagrams of a second example of the method for manufacturing the heat regenerating material particles according to the first embodiment.
Figure 5B:
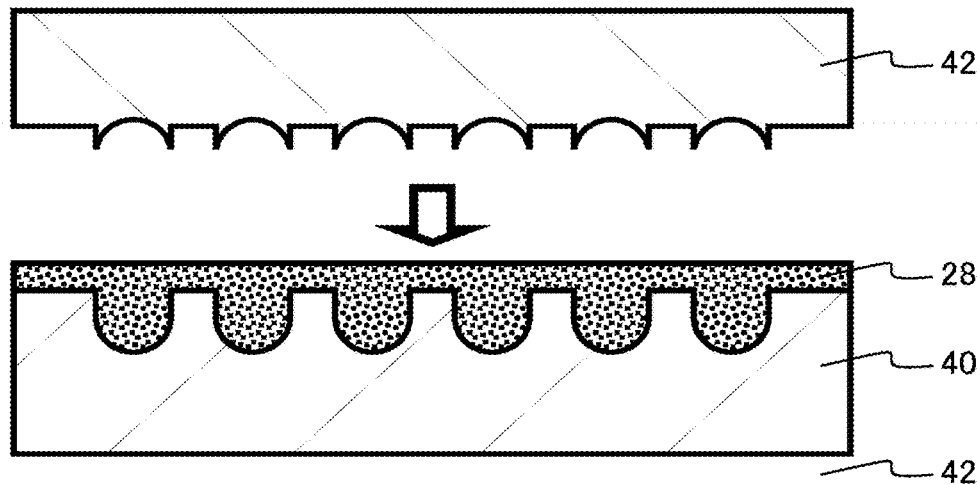
Figure 5C:
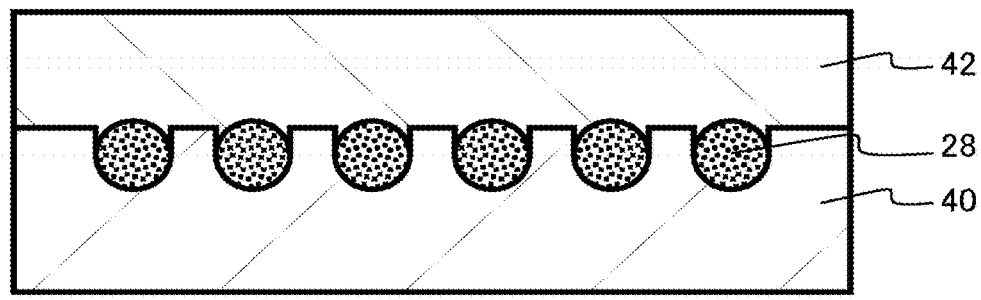

Next, a second example of the method for manufacturing the heat regenerating material particle 10 according to the first embodiment will be described. FIGS. 5A, 5B, and 5C are explanatory diagrams of the second example of the method for manufacturing the heat regenerating material particle according to the first embodiment.

The procedure is similar to that in the first example until the slurry 28 is mixed while the solvent in the slurry 28 is volatilized.

In a stage when the viscosity of the slurry 28 increases and the slurry 28 becomes clay-like, the slurry 28 is disposed on a lower die 40 (FIG. 5A). Hemispherical grooves are lined up in the lower die 40.

Next, the slurry 28 is sandwiched between the lower die 40 and an upper die 42 (FIG. 5B). Recessed hemispherical grooves are formed at a tip of the upper die 42.

The slurry 28 is pushed into the hemispherical grooves of the lower die 40 by the upper die 42 to form spherical particles (FIG. 5C).

Figure 6:
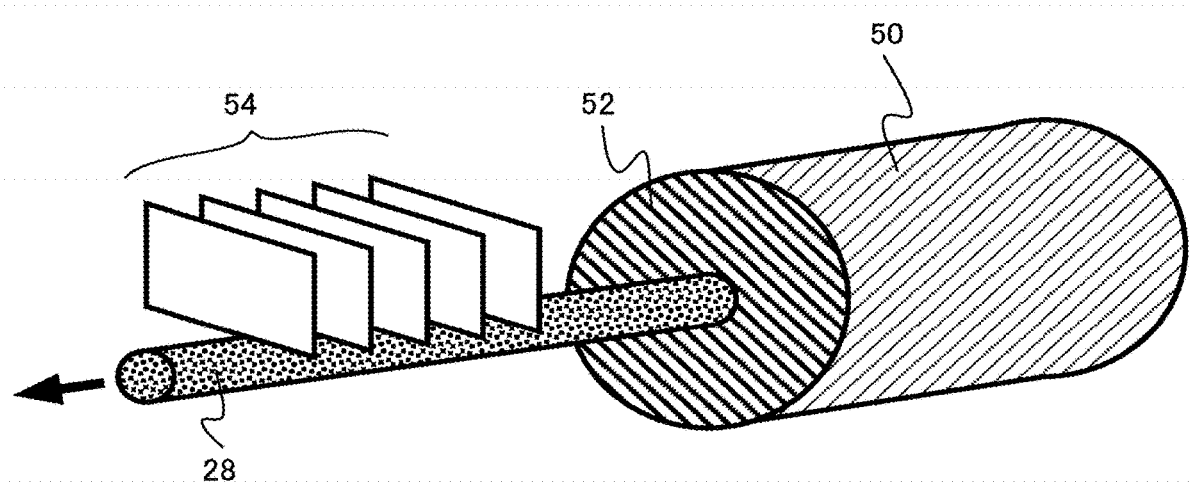
FIG. 6 is an explanatory diagram of a third example of the method for manufacturing the heat regenerating material particles according to the first embodiment.

Next, a third example of the method for manufacturing the heat regenerating material particle 10 according to the first embodiment will be described. FIG. 6 is an explanatory diagram of the third example of the method for manufacturing the heat regenerating material particle according to the first embodiment.

The procedure is similar to that in the first example until the slurry 28 is mixed while the solvent in the slurry 28 is volatilized.

In a stage when the viscosity of the slurry 28 increases and the slurry 28 becomes clay-like, the slurry 28 is filled into a container 50. The slurry 28 filled in the container 50 is pressed against a plate 52 with a hole, for example, using an extruding plate (not illustrated) in the container 50. The slurry 28 is discharged in a rod shape from the hole.

As another method, for example, pressure is applied to the plate 52 with a hole while the slurry 28 is continuously supplied by rotating a screw structure member (not illustrated) provided in the container 50. As a result, the slurry 28 shaped in a rod shape is continuously discharged from the hole.

Incidentally, as illustrated in FIG. 6, the plate 52 may have one hole or a plurality of holes. The plate 52 may be flat or spherical.

By cutting the rod-shaped slurry 28, for example, with a cutter 54, a columnar particle having an arbitrary length is obtained. For example, a spherical particle is obtained by applying a force to the particle or rounding corners of the particle.

Next, a fourth example of the method for manufacturing the heat regenerating material particle 10 according to the first embodiment will be described. Hereinafter, a case where the heat regenerating substance particles 11 are formed of $Ag_2O$ and the binder 12 is formed of an epoxy resin will be exemplified.

First, $Ag_2O$ powder is synthesized in a wet manner.

Next, the $Ag_2O$ powder is dispersed in at least one of a main agent and a curing agent of the epoxy resin. Next, the main agent and the curing agent are mixed.

Next, the mixture of the main agent and the curing agent is defoamed by evacuation. The mixture of the main agent and the curing agent is embedded in a punching sheet.

The mixture of the main agent and the curing agent is allowed to stand to be cured. It is also possible to shorten curing time by heating.

The mixture of the main agent and the curing agent acts to form particles, and then the particles are removed from the punching sheet.

Next, the removed particles are polished by barrel polishing or the like to round corners for spheroidizing and downsizing. The heat regenerating material particle 10 having a desired shape and particle diameter is manufactured by polishing.

Hereinafter, functions and effects of the heat regenerating material particle 10 according to the first embodiment will be described.

For a cryogenic refrigerator used for cooling a superconducting device, a heat regenerating material particle having a high volume specific heat value in a low temperature range is used. Examples of the heat regenerating material particle include a metal such as lead (Pb) or bismuth (Bi), a rare earth compound such as $HoCu_2$ or $Er_3Ni$, and an oxide such as $Ag_2O$, $Cu_2O$, or $Gd_2O_2S$.

For example, in a case of manufacturing an oxide heat regenerating material particle, multistage processes such as granulation of a powder raw material, sintering at high temperature, and spheroidizing by polishing are required. Therefore, a manufacturing process is complicated. Therefore, manufacturing cost of the heat regenerating material particle increases, and the heat regenerating material particle is expensive.

For example, in a case of manufacturing a heat regenerating material particle, the chemical composition or the crystal structure of a heat regenerating substance may change due to a reaction at the time of sintering at a high temperature, and it may be impossible to obtain desired characteristics. For example, in a case where the heat regenerating substance particles 11 are formed of $Gd_2O_2S$, sulfur (S) escapes due to a too high temperature disadvantageously. In a case where the heat regenerating substance particles 11 are formed of $Ag_2O$, oxygen (O) escapes due to a too high temperature disadvantageously. Therefore, in a portion where the composition has changed or a different compound has been generated, the characteristics may be deteriorated to make the characteristics of the heat regenerating material particle 10 unstable.

In the heat regenerating material particle 10 according to the first embodiment, the heat regenerating substance particles 11 are bonded using the resin binder 12. Therefore, at the time of manufacturing the heat regenerating material particle 10, at least sintering at a high temperature is unnecessary. Therefore, it is possible to manufacture the heat regenerating material particle 10 by a simple manufacturing process. Therefore, manufacturing cost of a heat regenerating material particle is reduced, and the heat regenerating material particle is inexpensive.

In addition, since sintering at a high temperature is unnecessary at the time of manufacturing the heat regenerating material particle 10, a change in the chemical composition or the crystal structure of a heat regenerating substance is suppressed. Therefore, the heat regenerating material particle 10 with stable characteristics is achieved.

The water insoluble resin contained in the binder 12 is preferably a polyvinyl butyral resin (PVB), a polyamide resin, or an epoxy resin.

Table 1 illustrates an evaluation result of a resin used for the binder 12. A result of a temperature cycle test on a resin as a candidate of the binder 12, an evaluation result of the mechanical strength of a heat regenerating material particle, and an overall evaluation result based on these results are illustrated.

In the temperature cycle test, the temperature of a resin alone was repeatedly changed at room temperature or at 77 K, and the number of cycles before breakage was evaluated. A case where the number of cycles before breakage was large was evaluated to be "good". A case where the number of cycles before breakage was particularly large was evaluated to be "excellent".

Regarding the mechanical strength of a heat regenerating material particle, the compression strength and the vibration strength of the heat regenerating material particle were evaluated. For the compression strength, the strength at which a heat regenerating material particle was broken by compression was measured. For the vibration strength, heat regenerating material particles were put in container and vibrated, and evaluation was made by the ratio of the number of broken heat regenerating material particles. A case where the compression strength and the vibration strength were high was evaluated to be "good". A case where the compressive strength and the vibration strength were particularly high was evaluated to be "excellent".

TABLE 1

| Resin name | Temperature cycle test | Mechanical strength | Overall evaluation |
|---|---|---|---|
| Acrylonitrile/butadiene/styrene | Acceptable | — | Acceptable |
| Epoxy | Good | Excellent | Excellent |
| Melamine | Good | Acceptable | Acceptable |
| Polyamide | Good | Good | Good |
| Polycarbonate | Acceptable | — | Acceptable |
| Polyethylene | Good | Acceptable | Acceptable |
| Polyethylene terephthalate | Acceptable | — | Acceptable |
| Acrylic | Acceptable | — | Acceptable |
| Polyacetal | Acceptable | — | Acceptable |
| Polypropylene | Acceptable | — | Acceptable |
| Polystyrene | Acceptable | — | Acceptable |
| Ethylene tetrafluoride | Good | Acceptable | Acceptable |
| Polyurethane | Good | — | Acceptable |
| Polyvinyl alcohol | Acceptable | — | Acceptable |
| Polyvinyl butyral | Excellent | Good | Excellent |
| Polyvinyl chloride | Acceptable | — | Acceptable |
| Silicone | Acceptable | — | Acceptable |

As illustrated in Table 1, good results were obtained for a polyvinyl butyral resin, a polyamide resin, and an epoxy resin. Very good results were obtained particularly for a polyvinyl butyral resin and an epoxy resin.

By using a polyvinyl butyral resin, a polyamide resin, or an epoxy resin for the binder 12, it is possible to achieve the heat regenerating material particle 10 having high resistance to thermal stress due to a temperature cycle and high mechanical strength. Therefore, by using a polyvinyl butyral resin, a polyamide resin, or an epoxy resin for the binder 12, reliability of the heat regenerating material particle 10 is improved.

The heat regenerating material particle 10 according to the first embodiment contains a water insoluble resin in the binder 12. For example, the heat regenerating material particle 10 may be exposed to the atmosphere when the heat regenerating material particle 10 is filled into a regenerator or maintenance of the regenerator is performed while the heat regenerating material particle 10 is filled in the regenerator.

If a water soluble resin is used for the binder 12, the heat regenerating material particle 10 easily absorbs moisture when being exposed to the atmosphere. While the temperature is lowered from room temperature to a cryogenic temperature by starting a refrigerator, the heat regenerating material particle 10 which has absorbed moisture may be broken because the moisture absorbed is frozen to cause volume expansion. In addition, if a water soluble resin is used for the binder 12, the resin may be dissolved in a case where the heat regenerating material particle 10 absorbs much moisture.

By using a water insoluble resin for the binder 12, the heat regenerating material particle 10 according to the first embodiment suppresses moisture absorption when being exposed to the atmosphere.

The heat regenerating substance particles 11 contained in the heat regenerating material particle 10 have an occupancy ratio preferably of 60% by volume or more, more preferably of 70% by volume or more, still more preferably of 80% by volume or more. By satisfying the above range, a high heat regenerating function can be achieved.

The occupancy ratio of the heat regenerating substance particles 11 contained in the heat regenerating material particle 10 is preferably 95% by volume or less. By satisfying the above range, the mechanical strength of the heat regenerating material particle 10 is increased.

The binder 12 contained in the heat regenerating material particle 10 has an occupancy ratio preferably of 5% by volume or more, more preferably of 8% by volume or more, still more preferably of 10% by volume or more. By satisfying the above range, the mechanical strength of the heat regenerating material particle 10 is increased.

The occupancy ratio of the binder 12 contained in the heat regenerating material particle 10 is preferably 40% by volume or less, more preferably 30% by volume or less, still more preferably 20% by volume or less, and particularly preferably 10% by volume or less. By satisfying the above range, the occupancy ratio of the heat regenerating substance particles 11 is increased, and a high heat regenerating function can be achieved.

The heat regenerating material particle 10 has a porosity preferably of less than 20% by volume, more preferably of less than 15% by volume, still more preferably of less than 12% by volume, particularly preferably of less than 10% by volume. By satisfying the above range, the occupancy ratio of the heat regenerating substance particles 11 is increased, and a high heat regenerating function can be achieved.

As described above, according to the first embodiment, a heat regenerating material particle that can be manufactured by a simple manufacturing process can be achieved. Therefore, manufacturing cost of a heat regenerating material particle is reduced, and an inexpensive heat regenerating material particle can be achieved. In addition, since a heat regenerating material particle can be formed at a low temperature, a heat regenerating material particle with stable characteristics can be achieved.

Second Embodiment

A heat regenerating material particle according to a second embodiment is different from that according to the first embodiment in that a plurality of heat regenerating substance particles contains a first particle and a second particle having a chemical composition different from the first particle. Hereinafter, matters overlapping with the first embodiment will be partially omitted.

Figure 7:
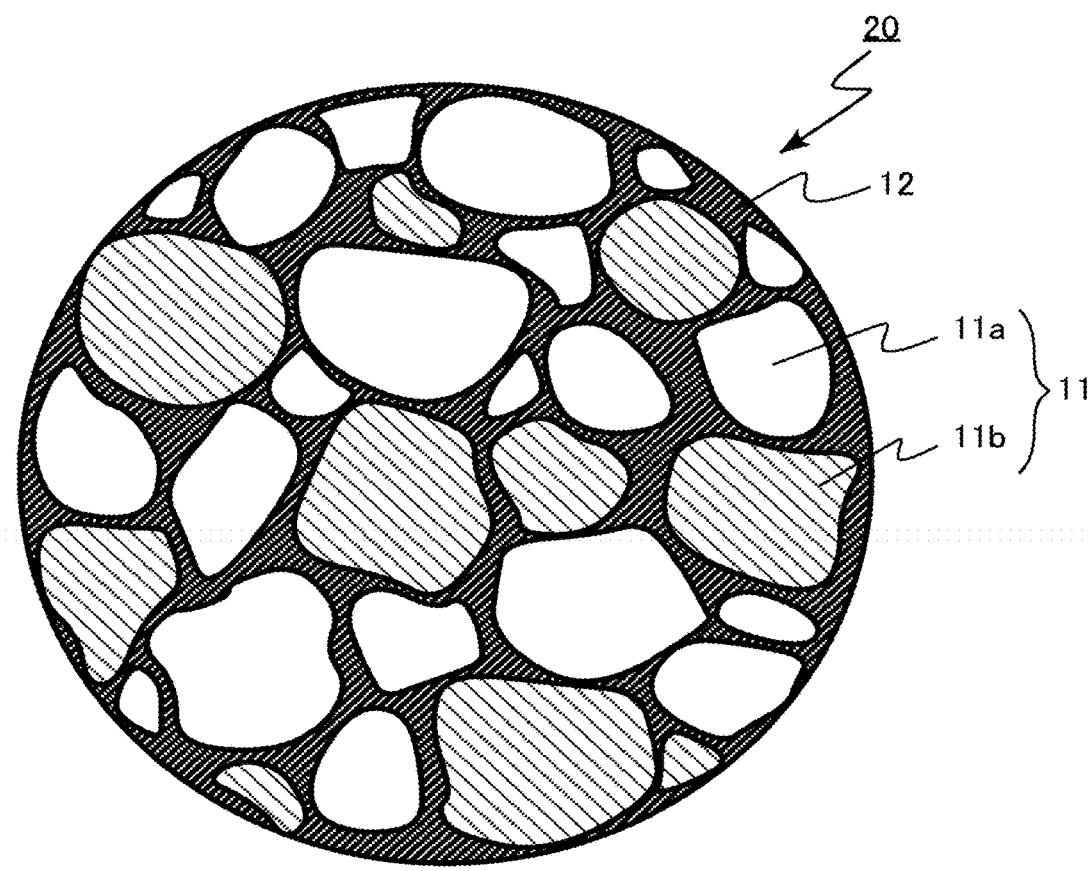
FIG. 7 is a schematic cross-sectional view of a heat regenerating material particle according to a second embodiment.

FIG. 7 is a schematic cross-sectional view of a heat regenerating material particle according to the second embodiment.

A heat regenerating material particle 20 includes a plurality of heat regenerating substance particles 11 and a binder 12. The heat regenerating substance particles 11 contain a first particle 11a and a second particle 11b. The chemical composition of the second particle 11b is different from that of the first particle 11a.

The first particle 11a contains, for example, an oxide as a main component. The second particle 11b contains, for example, a rare earth compound as a main component.

In addition, the first particle 11a contains, for example, a rare earth compound as a main component. The second particle 11b contains, for example, a metal as a main component.

In addition, the first particle 11a contains, for example, a rare earth compound as a main component. The second particle 11b contains, for example, a rare earth compound different from the first particle 11a as a main component.

The heat regenerating material particle 20 according to the second embodiment contains the first particle 11a and the second particle 11b having different chemical compositions. In other words, the heat regenerating material particle 20 contains the first particle 11a and the second particle 11b exhibiting a heat regenerating function in different temperature ranges. Therefore, the heat regenerating material particle 20 having a heat regenerating function in a wide temperature range can be achieved.

For example, the temperature at which volume specific heat is maximum is different between the first particle 11a and the second particle 11b.

The heat regenerating material particle 20 according to the second embodiment easily contains the first particle 11a and the second particle 11b having different chemical compositions in one heat regenerating material particle 20 by using the resin binder 12.

As described above, according to the second embodiment, a heat regenerating material particle that can be manufactured by a simple manufacturing process can be achieved as in the first embodiment. Therefore, manufacturing cost of a heat regenerating material particle is reduced, and an inexpensive heat regenerating material particle can be achieved. In addition, since a heat regenerating material particle can be formed at a low temperature, a heat regenerating material particle with stable characteristics can be achieved. In addition, a heat regenerating material particle having a heat regenerating function in a wide temperature range can be achieved.

Third Embodiment

A refrigerator according to a third embodiment includes a regenerator in which the heat regenerating material particles according to the first or second embodiment are filled. Hereinafter, description of matters overlapping with the first or second embodiment will be partially omitted.

Figure 8:
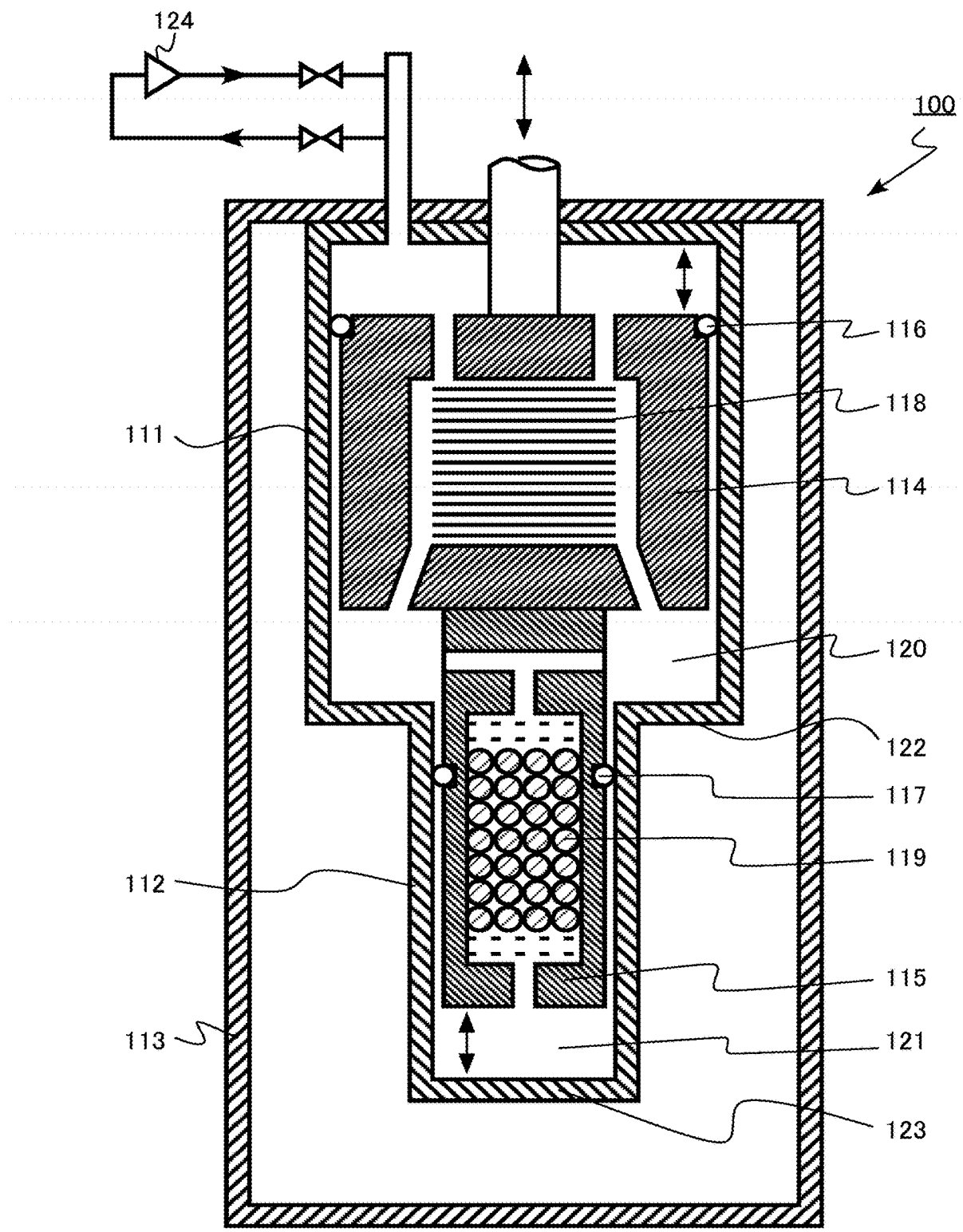
FIG. 8 is a schematic cross-sectional view illustrating a configuration of a main part of a refrigerator according to a third embodiment.

FIG. 8 is a schematic cross-sectional view illustrating a configuration of a main part of the refrigerator according to the third embodiment. The refrigerator according to the third embodiment is a two-stage heat regenerating cryogenic refrigerator 100 used for cooling a superconducting device or the like.

The heat regenerating cryogenic refrigerator 100 includes a first cylinder 111, a second cylinder 112, a vacuum container 113, a first regenerator 114, a second regenerator 115, a first seal ring 116, a second seal ring 117, a first heat regenerating material 118, a second heat regenerating material 119, a first expansion chamber 120, a second expansion chamber 121, a first cooling stage 122, a second cooling stage 123, and a compressor 124.

The heat regenerating cryogenic refrigerator 100 includes the vacuum container 113 in which the large diameter first cylinder 111 and the small diameter second cylinder 112 coaxially connected to the first cylinder 111 are disposed. In the first cylinder 111, the first regenerator 114 is disposed so as to freely reciprocate. In the second cylinder 112, the second regenerator 115 as an example of the regenerator according to the third embodiment is disposed so as to freely reciprocate.

The first seal ring 116 is disposed between the first cylinder 111 and the first regenerator 114. The second seal ring 117 is disposed between the second cylinder 112 and the second regenerator 115.

The first heat regenerating material 118 such as a Cu mesh is housed in the first regenerator 114. The heat regenerating material particles 10 according to the first embodiment or the heat regenerating material particles 20 according to the second embodiment are filled in the second regenerator 115 as the second heat regenerating material 119.

The first regenerator 114 and the second regenerator 115 each have a passage of a working medium provided in a gap or the like of the first heat regenerating material 118 or the second heat regenerating material 119. The working medium is helium gas.

The first expansion chamber 120 is provided between the first regenerator 114 and the second regenerator 115. The second expansion chamber 121 is provided between the second regenerator 115 and a tip wall of the second cylinder 112. The first cooling stage 122 is provided at a bottom of the first expansion chamber 120. The second cooling stage 123 having a temperature lower than the first cooling stage 122 is formed at a bottom of the second expansion chamber 121.

The first expansion chamber 120 is provided between the first regenerator 114 and the second regenerator 115. The second expansion chamber 121 is provided between the second regenerator 115 and a tip wall of the second cylinder 112. The first cooling stage 122 is provided at a bottom of the first expansion chamber 120. The second cooling stage 123 having a temperature lower than the first cooling stage 122 is formed at a bottom of the second expansion chamber 121.

To the two-stage heat regenerating cryogenic refrigerator 100 described above, a high-pressure working medium is supplied from the compressor 124. The supplied working medium passes through the first heat regenerating material 118 housed in the first regenerator 114 and reaches the first expansion chamber 120. Then, the working medium passes through the second heat regenerating material 119 housed in the second regenerator 115 and reaches the second expansion chamber 121.

At this time, the working medium is cooled by supplying thermal energy to the first heat regenerating material 118 and the second heat regenerating material 119. The working medium that has passed through the first heat regenerating material 118 and the second heat regenerating material 119 expands in the first expansion chamber 120 and the second expansion chamber 121 to generate cold. Then, the first cooling stage 122 and the second cooling stage 123 are cooled.

The working medium that has expanded flows in the opposite direction through the first heat regenerating material 118 and the second heat regenerating material 119. The working medium receives thermal energy from the first heat regenerating material 118 and the second heat regenerating material 119 and is then discharged. The heat regenerating cryogenic refrigerator 100 is configured such that the thermal efficiency of a working medium cycle is improved to achieve a lower temperature as a recuperative effect becomes better in this process.

As described above, according to the third embodiment, an inexpensive refrigerator can be achieved by using an inexpensive heat regenerating material particle. In addition, by using a heat regenerating material particle with stable characteristics against a cycle of a large temperature change reaching a cryogenic temperature, a highly reliable cryogenic refrigerator capable of stably providing high efficiency cooling performance for a long time can be achieved.

Fourth Embodiment

A superconducting magnet according to a fourth embodiment includes the refrigerator according to the third embodiment. Hereinafter, matters overlapping with the third embodiment will be partially omitted.

Figure 9:
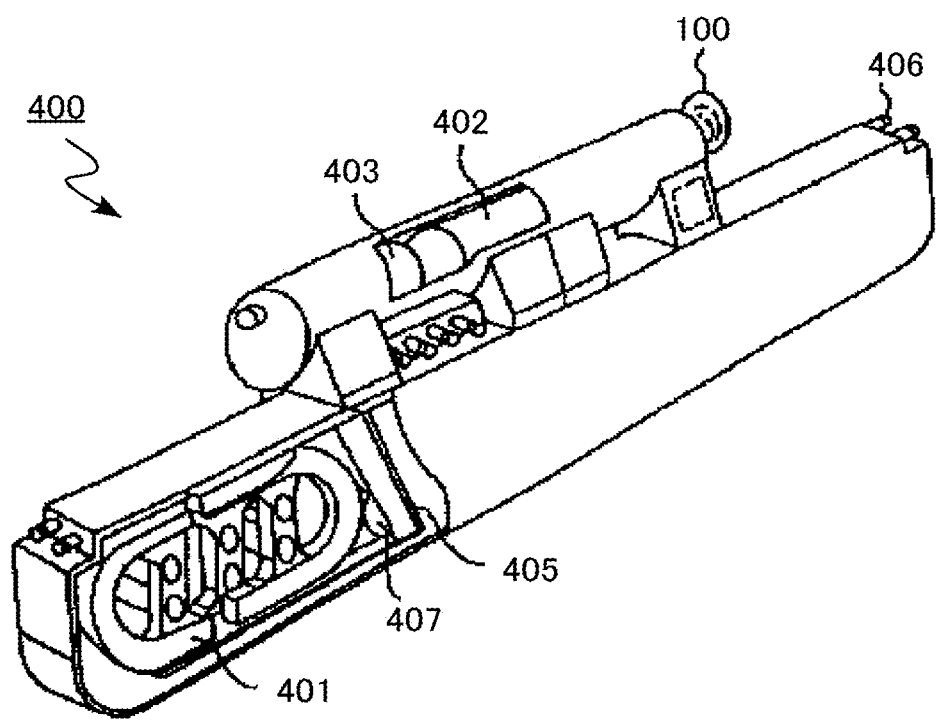
FIG. 9 is a perspective view illustrating a schematic configuration of a superconducting magnet according to a fourth embodiment.

FIG. 9 is a perspective view illustrating a schematic configuration of the superconducting magnet according to the fourth embodiment. The superconducting magnet according to the fourth embodiment is a magnetically levitated train superconducting magnet 400 including the heat regenerating cryogenic refrigerator 100 according to the third embodiment.

The magnetically levitated train superconducting magnet 400 includes a superconducting coil 401, a liquid helium tank 402 for cooling the superconducting coil 401, a liquid nitrogen tank 403 for preventing volatilization of the liquid helium tank 402, a laminated thermal insulator 405, a power lead 406, a permanent current switch 407, and the heat regenerating cryogenic refrigerator 100.

According to the fourth embodiment, by using an inexpensive refrigerator, an inexpensive superconducting magnet can be achieved. In addition, by using a refrigerator with stable characteristics, a superconducting magnet with stable characteristics can be achieved.

Fifth Embodiment

A nuclear magnetic resonance imaging apparatus according to a fifth embodiment includes the refrigerator according to the third embodiment. Hereinafter, matters overlapping with the third embodiment will be partially omitted.

Figure 10:
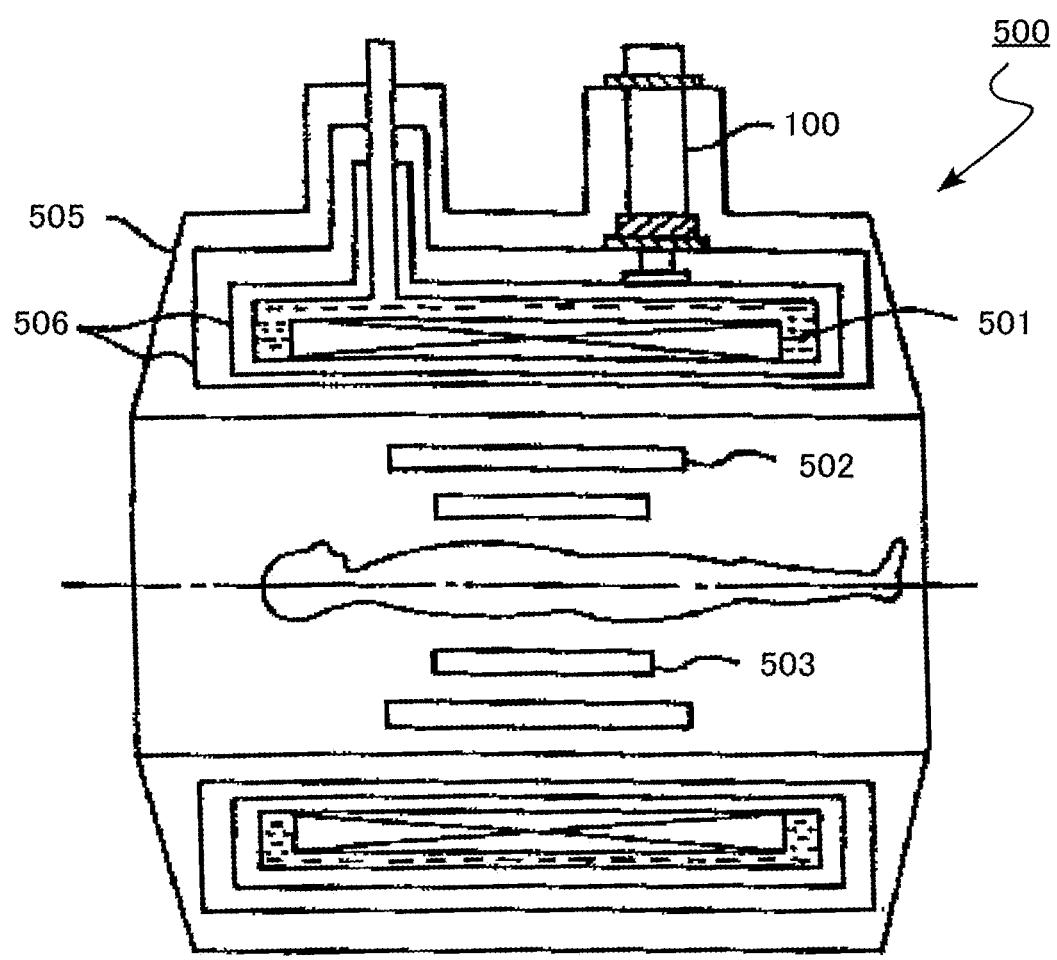
FIG. 10 is a cross-sectional view illustrating a schematic configuration of a nuclear magnetic resonance imaging apparatus according to a fifth embodiment.

FIG. 10 is a cross-sectional view illustrating a schematic configuration of the nuclear magnetic resonance imaging apparatus according to the fifth embodiment. The nuclear magnetic resonance imaging (MRI) apparatus according to the fifth embodiment is a nuclear magnetic resonance imaging apparatus 500 including the heat regenerating cryogenic refrigerator 100 according to the third embodiment.

The nuclear magnetic resonance imaging apparatus 500 using a nuclear magnetic resonance (NMR) phenomenon is an example of a nuclear magnetic resonance apparatus.

The nuclear magnetic resonance imaging apparatus 500 includes a superconducting static magnetic field coil 501 for applying a spatially uniform and temporally stable static magnetic field to a human body, a correction coil (not illustrated) for correcting nonuniformity of a generated magnetic field, a gradient magnetic field coil 502 for imparting a magnetic field gradient to a measurement region, a radio wave transmitting/receiving probe 503, a cryostat 505, and a radiant heat insulation shield 506. The heat regenerating cryogenic refrigerator 100 is used for cooling the superconducting static magnetic field coil 501.

According to the fifth embodiment, by using an inexpensive refrigerator, an inexpensive nuclear magnetic resonance imaging apparatus and nuclear magnetic resonance apparatus can be achieved. In addition, by using a refrigerator with stable characteristics, a nuclear magnetic resonance imaging apparatus and a nuclear magnetic resonance apparatus with stable characteristics can be achieved.

Sixth Embodiment

A cryopump according to a sixth embodiment includes the refrigerator according to the third embodiment. Hereinafter, matters overlapping with the third embodiment will be partially omitted.

Figure 11:
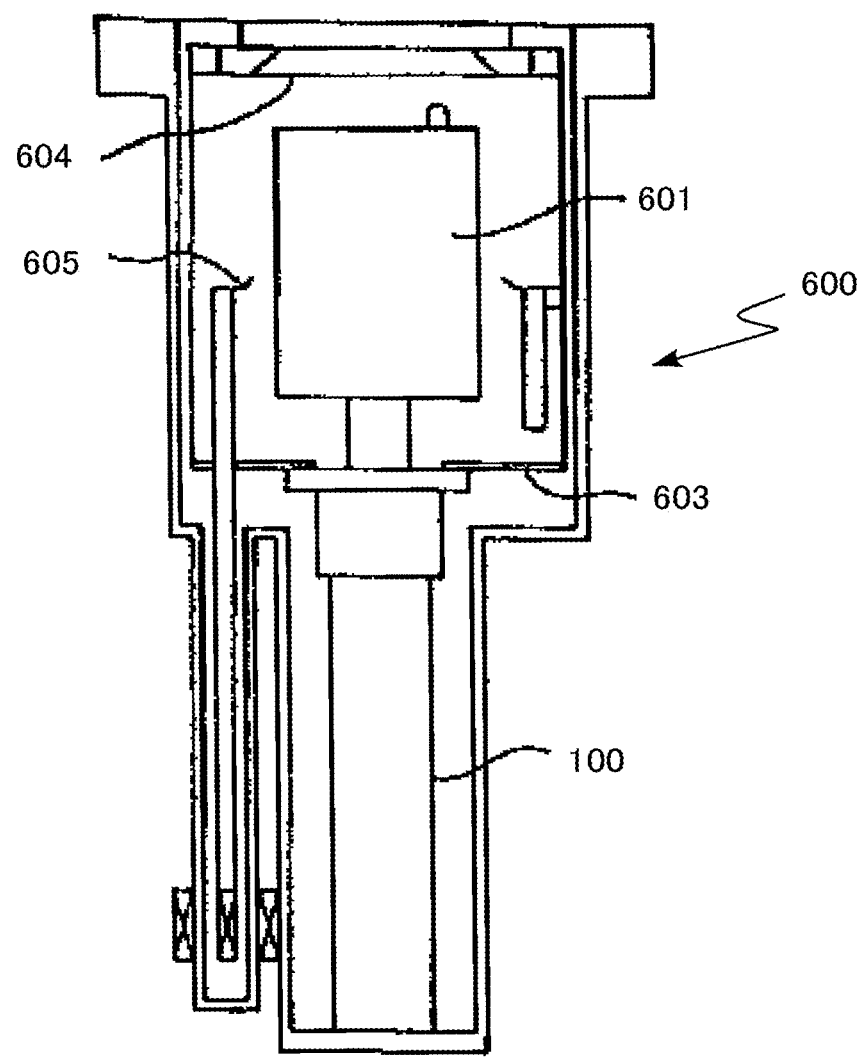
FIG. 11 is a cross-sectional view illustrating a schematic configuration of a cryopump according to a sixth embodiment.

FIG. 11 is a cross-sectional view illustrating a schematic configuration of the cryopump according to the sixth embodiment. The cryopump according to the sixth embodiment is a cryopump 600 including the heat regenerating cryogenic refrigerator 100 according to the third embodiment.

The cryopump 600 includes a cryopanel 601 for condensing or adsorbing a gas molecule, the heat regenerating cryogenic refrigerator 100 for cooling the cryopanel 601 to a predetermined cryogenic temperature, a shield 603 provided between the cryopanel 601 and the heat regenerating cryogenic refrigerator 100, a baffle 604 provided in an inlet, and a ring 605 for changing a discharge speed of argon, nitrogen, hydrogen, or the like.

According to the sixth embodiment, by using an inexpensive refrigerator, an inexpensive cryopump can be achieved. In addition, by using a refrigerator with stable characteristics, a cryopump with stable characteristics can be achieved.

Seventh Embodiment

A magnetic field application type single crystal pulling apparatus according to a seventh embodiment includes the refrigerator according to the third embodiment. Hereinafter, matters overlapping with the third embodiment will be partially omitted.

Figure 12:
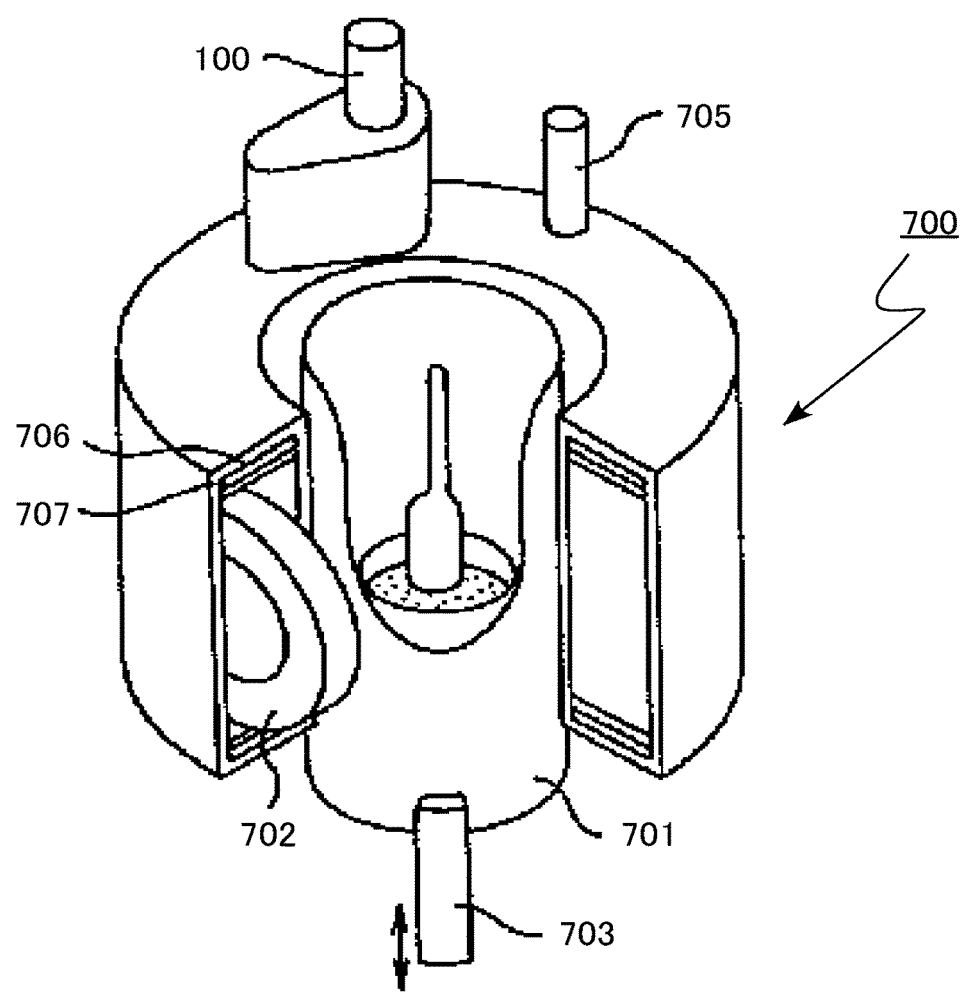
FIG. 12 is a perspective view illustrating a schematic configuration of a magnetic field application type single crystal pulling apparatus according to a seventh embodiment.

FIG. 12 is a perspective view illustrating a schematic configuration of the magnetic field application type single crystal pulling apparatus according to the seventh embodiment. The magnetic field application type single crystal pulling apparatus according to the seventh embodiment is a magnetic field application type single crystal pulling apparatus 700 including the heat regenerating cryogenic refrigerator 100 according to third embodiment.

The magnetic field application type single crystal pulling apparatus 700 includes a single crystal pulling unit 701 including a raw material melting crucible, a heater, a single crystal pulling mechanism, and the like, a superconducting coil 702 for applying a static magnetic field to a raw material melt, a lifting mechanism 703 for the single crystal pulling unit 701, a current lead 705, a heat shield plate 706, and a helium container 707. The heat regenerating cryogenic refrigerator 100 is used for cooling the superconducting coil 702.

According to the seventh embodiment, by using an inexpensive refrigerator, an inexpensive magnetic field application type single crystal pulling apparatus can be achieved. In addition, by using a refrigerator with stable characteristics, a magnetic field application type single crystal pulling apparatus with stable characteristics can be achieved.

Incidentally, as in the fourth, fifth, and seventh embodiments, in a case of using a refrigerator for cooling a superconducting magnet, the heat regenerating substance particles 11 are particularly preferably formed of a nonmagnetic material. The reason for this is that, in the fourth and seventh embodiments, a shaft of a refrigerator may be bent by reception of a force by a magnetic material in a magnetic field. In addition, the reason is that, in the fifth embodiment, a magnetic material reciprocates in a magnetic field to generate a magnetic noise, and a nuclear magnetic resonance signal may be hindered.

While certain embodiments have been described, these embodiments have been presented by way of example only, and are not intended to limit the scope of the inventions. Indeed, heat regenerating material particle, regenerator, refrigerator, superconducting magnet, nuclear magnetic resonance imaging apparatus, nuclear magnetic resonance apparatus, cryopump, and magnetic field application type single crystal pulling apparatus described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A regenerator comprising: a plurality of heat regenerating materials, which comprise
    a plurality of heat regenerating substance particles having a maximum volume specific heat value of 0.3 $J/cm^3 \cdot K$ or more at a temperature of 20 K or lower; and
    a binder bonding the heat regenerating substance particles, the binder containing water insoluble resin, wherein
    the water insoluble resin is a polyvinyl butyral resin,
    the heat regenerating material has a particle diameter of 500 μm or less, and the binder has an occupancy ratio of more than 5% by volume in the heat regenerating material.

2. A refrigerator comprising the regenerator according to claim 1.

3. A superconducting magnet comprising the refrigerator according to claim 2.

4. A nuclear magnetic resonance imaging apparatus comprising the refrigerator according to claim 2.

5. A nuclear magnetic resonance apparatus comprising the refrigerator according to claim 2.

6. A cryopump comprising the refrigerator according to claim 2.

7. A magnetic field application type single crystal pulling apparatus comprising the refrigerator according to claim 2.

* * * * *